US012610589B1

(12) United States Patent
Thomas et al.

(10) Patent No.: US 12,610,589 B1
(45) Date of Patent: *Apr. 21, 2026

(54) FCNVM-ALEFD (FULLY COVERED NON-VOLATILE MEMORY (NVM) OVER ADVANCED LOW ELECTROSTATIC FIELD TRANSISTOR (ALEFD)

(71) Applicants: Mammen Thomas, Seattle, WA (US);
Arun Mammen Thomas, Dublin, CA (US)

(72) Inventors: Mammen Thomas, Seattle, WA (US);
Arun Mammen Thomas, Dublin, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/285,345

(22) Filed: Jul. 30, 2025

(51) Int. Cl.
| | |
|---|---|
| *H10D 30/68* | (2025.01) |
| *H10D 30/01* | (2025.01) |
| *H10D 62/10* | (2025.01) |
| *H10D 62/13* | (2025.01) |
| *H10D 64/27* | (2025.01) |

(52) U.S. Cl.
CPC ....... *H10D 30/683* (2025.01); *H10D 30/0411* (2025.01); *H10D 30/6894* (2025.01); *H10D 62/102* (2025.01); *H10D 62/151* (2025.01); *H10D 64/518* (2025.01)

(58) Field of Classification Search
CPC .................. H10D 30/683; H10D 30/6894
See application file for complete search history.

(56) References Cited

U.S. PATENT DOCUMENTS

| | | | | |
|---|---|---|---|---|
| 7,376,014 | B2 * | 5/2008 | Thomas | H10D 30/6891 |
| | | | | 365/185.26 |
| 9,059,302 | B2 * | 6/2015 | Van Der Zanden | |
| | | | | H10D 30/681 |
| 12,033,851 | B1 * | 7/2024 | Thomas | H10D 62/112 |
| 12,268,025 | B1 * | 4/2025 | Thomas | H10D 62/151 |
| 12,284,819 | B1 * | 4/2025 | Thomas | H10D 30/608 |
| 12,369,318 | B1 * | 7/2025 | Thomas | H10D 30/0411 |

* cited by examiner

*Primary Examiner* — Daniel Luke

(57) ABSTRACT

Device scaling has increased the device density of integrated circuits (ICs) and reduced the cost of circuits. Today development of new device structures, use of new materials and complex process steps are implemented to continue scaling of the semiconductor devices. The added manufacturing steps and complexity have increased cost of ICs directly impacting the implementation of IoT devices that need low cost and high yields to be successful. ALEFT—is a device that reduces the cost of manufacture while allowing scaling and improving device performance. A requirements of IoT devices is the ability to store data on chips using integratable memory. FCNVM-ALEFT is an integratable non-volatile memory device with a protected floating gate that is integratable with the ALEFT devices with minimum additional processing. ALEFT devices integrated with FCNVM-ALEFT is a suitable technology combination for the IoT devices.

16 Claims, 6 Drawing Sheets

FIG.6

Table 1. Figure & Numbering

| Sr # | FIG.# | Number | Description |
|------|-------|--------|-------------|
| 1 | FIG.2 | 101 | Substrate |
| 2 | | 102 | Surface of Substrate |
| 3 | | 103 | Well in substrate |
| 4 | | 104 | Shallow trench Isolation dielectric |
| 5 | | 105 comprising 105-1 &105-2 | Selective low temp Epitaxy for source extension and for drain extension over the sbstrate surface The separation between 105-1 and 105-2 defining the gate region. |
| 6 | | 106 | Metal overlay on Selective Epitaxial layer (optional) |
| 7 | | 107 | Gate dielectric dep on the selective epi(or on optional metal) |
| 8 | | 108 | Tunnel dielectric on semiconductor surface |
| 9 | | 109 | Gate length defining etch to semiconductor substrate |
| 10 | | 110 | Thick dielectric over selective epi with or without optional metal |
| 11 | FIG.3 | 201/110 | Thick dielectric over selective epi with or without optional metal |
| 12 | | 202 | Gate sidewall isolation dielectric |
| 13 | | 203 | Selective epi Sidewall isolation over shallow trench isolation |
| 14 | FIG.4 | 301 | Conductive floating gate |
| 15 | | 302 | Coupling Dielectric |
| 16 | | 303 | Conductive control gate |
| 17 | | 304 | Control gate sidewall isolation |
| 18 | | 305 | Control gate top isolation dielectric |
| 19 | FIG.1&5 | 401 | Inter layer dielectric (ILD) |
| 20 | | 402 | Polished Planarized ILD surface |
| 21 | | 403 | Saliside in Via |
| 22 | | 404 | Metal filled and polished Via |

The NVM device in fig 5 is now ready for first metal layer of the multi level metallization

FIG.7

Table 2. Typical Process Flow with optional metal over selective epi for series resistance reduction:

| Sr # | Process Step | Mask | Implant |
|---|---|---|---|
| 1 | Start wafer & do shallow trench isolation | 1 | 1 |
| 2. | Standard Well implant for P & N | 1 | 2 |
| 3. | Grow sac ox and Dep Nitride | 0 | 0 |
| 4. | Mask P regions clean N sac oxide | 1 | 0 |
| 5. | Grow selective N-epi ( graded- high surface doping) | 0 | 0 |
| 6. | Optional Metal deposition | 0 | 0 |
| 7. | Mask etch off metal from Non NVM regions | 1 | 0 |
| 8. | Deposit thick isolation oxide | 0 | 0 |
| 8. | Gate oxide /optional metal /epi etch | 1 | 0 |
| 9. | Gate dielectric deposition(anisotropic) | 0 | 0 |
| 10. | Gate and epi sidewall dielectric | 0 | 0 |
| 11. | Sidewall dielectric etch (anisotropic) | 0 | 0 |
| 12. | Floating gate deposition | 0 | 0 |
| 13. | Floating gate mask and etch | 1 | 0 |
| 14. | Coupling dielectric dep | 0 | 0 |
| 15. | Coupling dielectric Mask and etch off | 1 | 0 |
| 16. | Contol gate dep and polish | 0 | 0 |
| 17. | Control gate mask & Etch | 1 | 0 |
| 18. | Control gate protection dielectric (optional dep) | 0 | 0 |
| 19. | ILD dep and polish planarize | 0 | 0 |
| 20. | Via Mask and etch to metal/ conductive control gate | 1 | 0 |
| 21. | Saliside dep in via | 0 | 0 |
| 22. | Via metal fill and polish back | 0 | 0 |
| | Total | 9 | 3 |

FIG.8

Table 3. Expansion of short forms used in the specification.

| Sr. # | Used short form | Expanded detail |
|-------|-----------------|-----------------|
| 1. | NVM | Non Volatile Memory |
| 2. | FCNVM | Fully covered non Volatile memory |
| 3 | ALEFT | Advances low Electrostatic Field Transistor |
| 4 | FCNVM-ALEFT | Fully covered Non Volatile Memory over Advanced low electrostatic field transistor |
| 5. | IC | Integrated Circuit |
| 6. | SOC | System on Chip |
| 7. | S/D | Source / Drain |
| 8. | NVM-ALEFT-ISD-LTSEE | Non Volatile Memory over Advanced low electric field transistor using Implanted source / drain and selective low temperature epitaxial extension. |

FCNVM-ALEFD (FULLY COVERED NON-VOLATILE MEMORY (NVM) OVER ADVANCED LOW ELECTROSTATIC FIELD TRANSISTOR (ALEFD)

FIELD OF INVENTION

This invention relates to a non-volatile memory cell using a new semiconductor device and processing of the same with low or reduced electrostatic fields reducing short channel issues and threshold voltage variability for ensuring high quality characteristics of operation of miniaturized devices.

BACKGROUND OF THE INVENTION AND THE NEED FOR THE INVENTION

Over the past decade or more scaling of the semiconductor devices has been following Moore's law. But the scaling is bumping against issues of high levels of doping, short channel effects, and threshold variations due to random dopant distribution near and under the gate, that limit the capabilities, quality and characteristics of these small devices.

Device scaling has been instrumental in increasing the device density of integrated circuits (ICs) and reducing the cost of these circuits. Today development of new device structures, use of new materials and implementation of complex process steps have to be considered to continue scaling of the semiconductor devices. The number of steps and cost of each step of processing ICs have also increased with the complexity increase. These process and technology innovations come with associated cost for circuit implementations.

Memories such as non-volatile memories and dynamic and static rams that can be integrated with the new devices will be useful enablers especially if the memory devices can be produced on the same semiconductor substrate without introducing too many additional complex process steps.

As the device sizes have become smaller with lower operating voltages the volume or charge that can be collected and stored in the floating gate reduces and the impact of any external contaminants become larger.

It will hence be optimum if a simple Non-volatile memory (NVM) device structure with simple processing (with reduced number of steps) that is closer to the original process flows in the fab is made available to continue the scaling of usable devices. As of date 15 to 28 nm devices are the major drivers for IoT as they are manufacturable in the fab with reasonable costs. These devices should be capable of being integrated into the advanced process with reduced short channel effects, it will be a boon to the IoT community. It will also be optimum if reduced access of external contaminants to the floating gate is provided at the same time.

The U.S. patent application Ser. No. 18/786,937 dated Jul. 29, 2024 for NVM (Non Volatile memory) over ALEFD (Advanced Low Electrostatic Field Device (or) Transistor) technology using implanted S/D with low temperature selective Epitaxy (the typical low temperature selective epitaxial growth or deposition is in the temperature range of 300-700 degree centigrade) is one such, that allows scaling of devices without undue stress on lithography to about 20 nm (existing masking capability in the range of 13 to 35 nm) with lower cost of masking and manufacture.

The technology also provides for low temperature processing of the device, especially after the low temperature selective epitaxial growth or deposition (typically the post processing after selective epitaxial growth or deposition is also controlled in the temperature range of 300-650 degree centigrade) which reduces or eliminates the diffusion of the dopants within and from the processed doped layers of the transistor.

The current sweet-spot for low cost device manufacture is 30 to 15 nm especially for IoT products that are very sensitive to cost of product which is limited by the manufacturing cost. Pushing the technology to a lower channel size without undue increase in manufacturing cost is always an aim for the device technologist. If integrated memory devices can be introduced with minimum process changes and complexity it will provide a much higher impact on the products. What is needed today is to find a way to scale the devices and include integrated memory devices such as NVM without increasing the process complexity and cost unduly.

Also, by having a fully covered floating gate for the NVM enables the floating gate to be isolated from the surrounds and protects it from any possible external contamination during post floating gate processing, packaging, and during operation.

This is what is being proposed in the current application. The Inventive Idea

The pending application Advanced Low Electrostatic Field Device (ALEFD) is to allow the gate/channel length of transistors to be scaled to the current sweet spot range of 30 nm to 10 nm and also below the 10 nm level, even down to 3 nm with appropriate masking of one layer on flat wafer/selective epi surface, without undue increase in cost of masking and manufacture. What is proposed in the current application is a way to integrate a fully covered and protected floating gate non-volatile memory (FCNVM) cell to the ALEFD with minimum impact on the process of manufacture.

DESCRIPTION OF FIGURES WITH NUMBERING

FIG. 1 is an exemplary and non-limiting cross section of a preferred embodiment of the current invention FIG. 2-5 are exemplary and non-limiting cross sectional view of an embodiment of manufacture the current invention showing the set of structural elements of the NVM (non-volatile memory) over an implementation of ALEFD {(Advanced Low Electrostatic Field Device {also called Advanced Low Electrostatic Field Transistor ALEFT), wherein the ALEFT uses Selective Low Temperature Epitaxial Extension Transistor/Device} per the invention.

FIG. 6 is a table 1 detailing the numbers used in the FIGS. 1-5. The numbers are used to provide the detailed explanation of the structure at various stages of the process.

FIG. 7 is a table 2 showing an exemplary and non-limiting process flow for the manufacture of the FCNVM-ALEFT device. The process flow shows the main steps of the process with the number of masking and implant steps used to generate the NVM.

FIG. 8 is a table 3 showing the expansion of some of the shortfoms used in the application.

Figure 1:
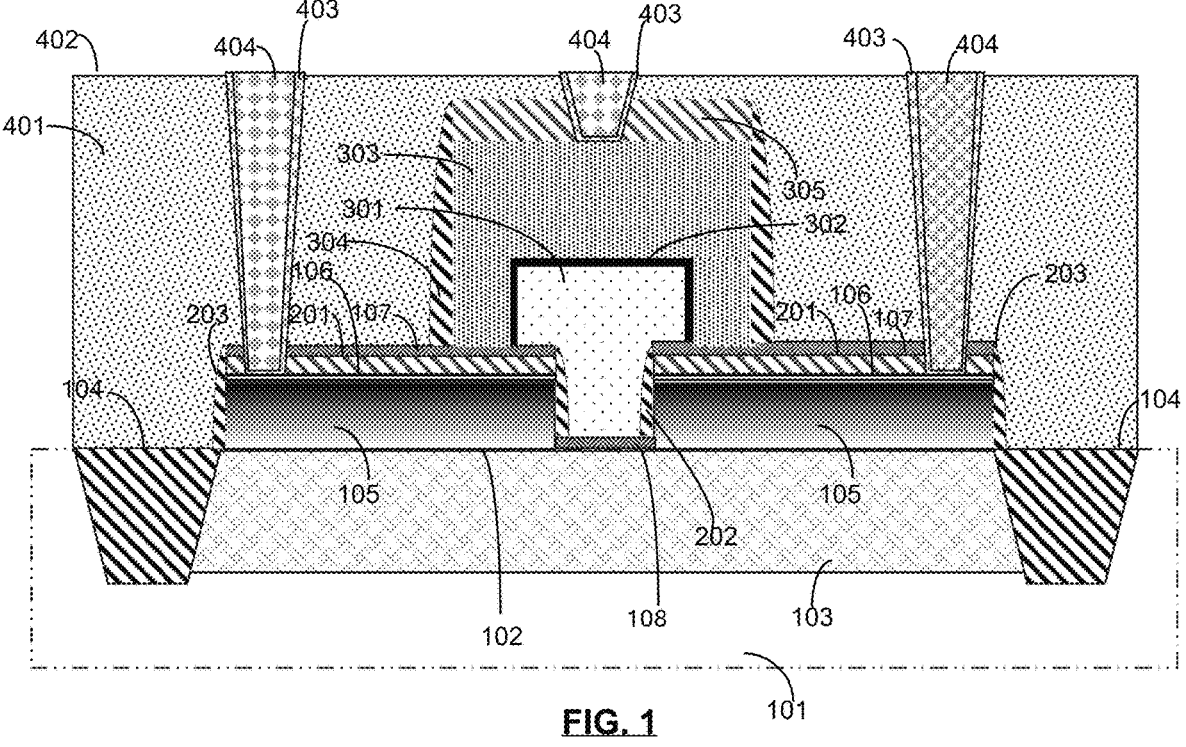

Even though the embodiment sown is currently the preferred embodiment it is not to be taken as a limiting embodiment. There can be and will be possible embodiments that improve on the current embodiment shown that arise out of knowledge base that exist today and future improvements in technology and processing over time.

Detailed Description of the (Fully Covered
Non-Volatile) FCNVM Over ALEFT {Advanced
Low Electrostatic Field Transistor (ALEFT)}

Device scaling has increased the device density of integrated circuits (ICs) and reduced the cost of circuits. Today development of new device structures, use of new materials and implementation of complex process steps are implemented to continue scaling of the semiconductor devices. The added manufacturing steps and complexity have resulted in increased cost of ICs directly impacting the implementation of IoT devices that need low cost and high yields to be successful.

ALEFT also called Advanced low electrostatic field transistor (ALEFT) is a patented device technology (U.S. patent Ser. No. 12/268,025 of Apr. 1, 2025) that reduces the cost while improving device performance. ALEFT is suitable for sub 20 nm sizes (typically 3-30 nm gate lengths) where random threshold variation due to impact of discrete dopants in and around the channel becomes a critical consideration. By using low temperature epitaxial deposition on the surface of the semiconductor substrate for source and drain extensions instead of implanted source and drain extensions, the random threshold variation due to impact of discrete dopants in and around the channel is reduced by elimination of the implants and associated thermal drives. This also results in creating a flat field profile at and around the gate enhancing the gate control of the device channel under the gate. By use of low temperature epitaxy as source/drain extension on the surface of the semiconductor substrate, the short channel effects and the impact of line edge variations of the gate are also reduced.

The disclosed and patented (U.S. Pat. Nos. 12,033,851; 12,268,025 and 12,284,819, that are included herein in their entirety by reference, cover the ALEFT technology and processes used enable the ALFT device to achieve smaller gate lengths and associated channel sizes (gate/channel shrinkage). A non-volatile cell implemented over the ALFT technology has been proposed titled "NVM-ALEFT-ISD-LTSEE" having a U.S. patent application Ser. No. 18/786, 937 dated Jul. 29, 2024 (currently U.S. Pat. No. 12,369,318). The current application FCNVM-ALEFT builds on the NVM-ALEFT-ISD-LTSEE technology by enabling five side coverage of the floating gate. The FCNVM-ALEFT prevents contamination of the floating gate and shows a preferred embodiment by building the NVM using further patented advances over the on the original ALEFT-ISD-LTSEE.

As indicated a simplified device technology that can be implemented with a reduced number of masking and process has been identified and patented for the ALEFT, as shown and claimed in U.S. Pat. No. 12,284,318. The device structure reduces the effect of short channel effects on the operation of the devices developed and allow the devices to be scaled with minimum increase in process complexity. The processing is made much simpler by reduction or elimination of implant steps and associated high temperature activation/drives but uses new available technology with lower temperature processing and low temperature selective epitaxial depositions. The replacement/elimination of critical implant around the gate of the device and the associated thermal activation steps reduce uncertainty of dopant location relative to the channel and help reduce the associated variability of device characteristics. The reduction in short channel effects and reduction in variability of device characteristics enable the devices to move down the device scaling and integration path. The disclosed device and technology are usable for device processing on planar semiconductor wafers, on Silicon on Insulator (SOI) and even for unique device structures like FinFET at and below the 20 nm device dimensions.

One of the enablers to the use of the technology, especially in IoT devices is the ability to integrate non-volatile memory into the product without unduly increasing the wafer cost by introduction of complex process technologies. The ALEFT transistor allows integration of the NVM cell with minimum technological challenge.

FIG. 1 shows an exemplary embodiment showing a cross section of the NVM-ALEFT transistor and the structural details. FIGS. 2-5 show cross section of the device through the process of manufacturing. FIG. 6 is a table 1 detailing the numbering used in the FIGS. 1 to 5. FIG. 7 is a table 2 showing an exemplary process flow for the device FCNVM-ALEFT—device shown in FIG. 1 The embodiment defines the gate width by a critical masking and separation of the low temperature selective epitaxial source and drain extensions (105-1 and 105-2). These low temperature selective epitaxial source drain extensions (105) are enabled for variations in selective epitaxial thickness adjustment and in-situ doping as required to adjust the S/D resistance of the finished FCNVM-ALEFT transistor device through in situ graded doping of the epitaxial extension. Implanting the low temperature epitaxial silicon using low voltage implanters is hence not ruled out as long as the effect of knock on ions into the substrate can be mitigated or eliminated. Use of a metal layer (106) over the low temperature epitaxial layer has also been proposed in the preferred embodiment described in FIG. 1.

Figure 2:
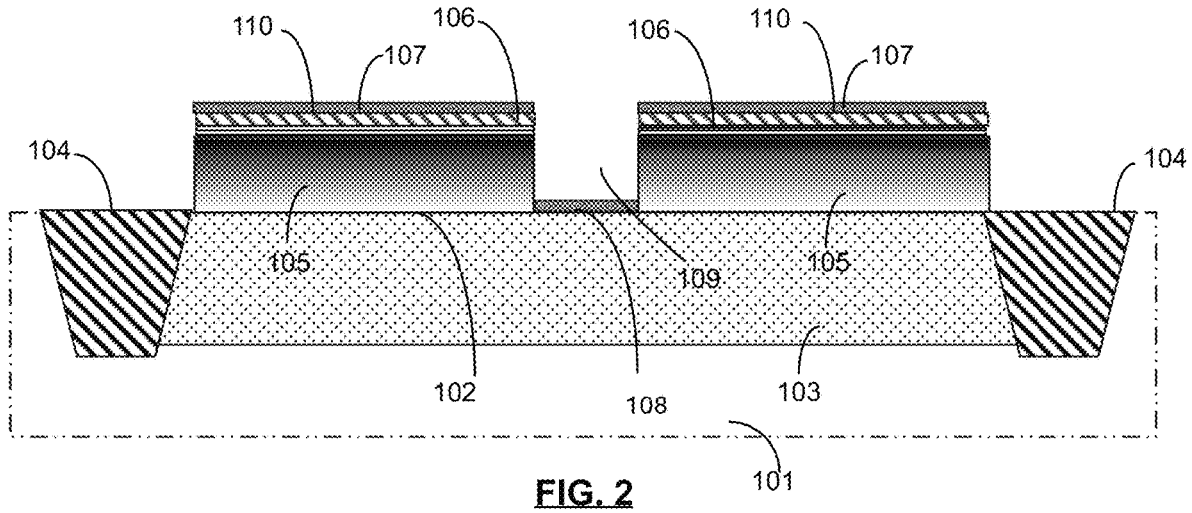

FIG. 2 shows the starting steps using a flat substrate wafer 101, with a flat surface 102, with shallow trench isolation and a well 103, formed in the substrate 101. A low temperature selective epitaxy 105, is grown on the substrate surface 102, having a graded in situ doping with a high doping concentration at the top surface of the low temperature epi 105. In the preferred embodiment an optional thin metal layer 106, is deposited over the selective epi 105, surface to reduce a source/drain resistance of the finished device. A thicker dielectric 110, over the selective epi 105, (or the optional metal layer 106, is used to isolate further conductive layers deposited over the selective epi 105. The thicker oxide layer 110, the optional metal layer and the selective epi layer 105, are defined and etched to form the gate region 109. The etched epi regions 105-1 and 105-2 form the drain and source extensions on either side of the tunnel dielectric 108 deposited within the gate etched region 109. A tunnel dielectric 108 is non-isotopically deposited on the exposed semiconductor surface 102 exposed within the etched region 109 and the surface of the dielectric isolation 110.

Typical processing can use the width of the etched separation between the source and drain selective epitaxial extensions 105-1 and 105-2 to define the gate width on the semiconductor substrate surface. A tunnel dielectric 108 is deposited within the etched gate region on the surface of the semiconductor substrate. By removing the implants from the vicinity of the channel and instead using the low temperature selective epitaxial growth for source and drain extensions, the influence of the vertical field at the channel edge, influencing/controlling the channel is reduced. Typically, due to the flat nature of the fields around the gate the electrostatic fields perpendicular to the plane of the gate dielectric to substrate interface are reduced to less than $5\times10^5$ volts/cm over more than 50% of the channel area under all operating conditions.

Figure 3:
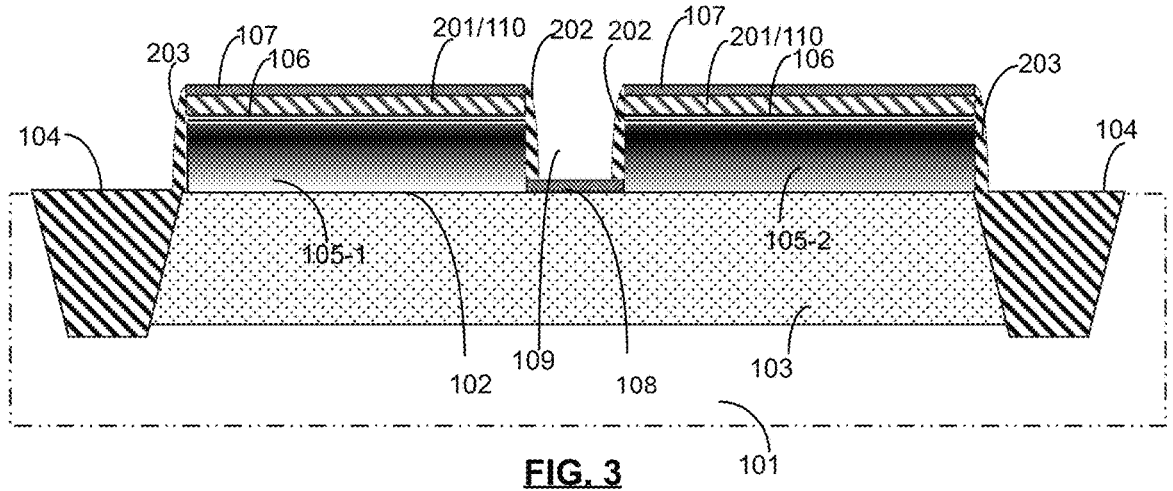
Figure 4:
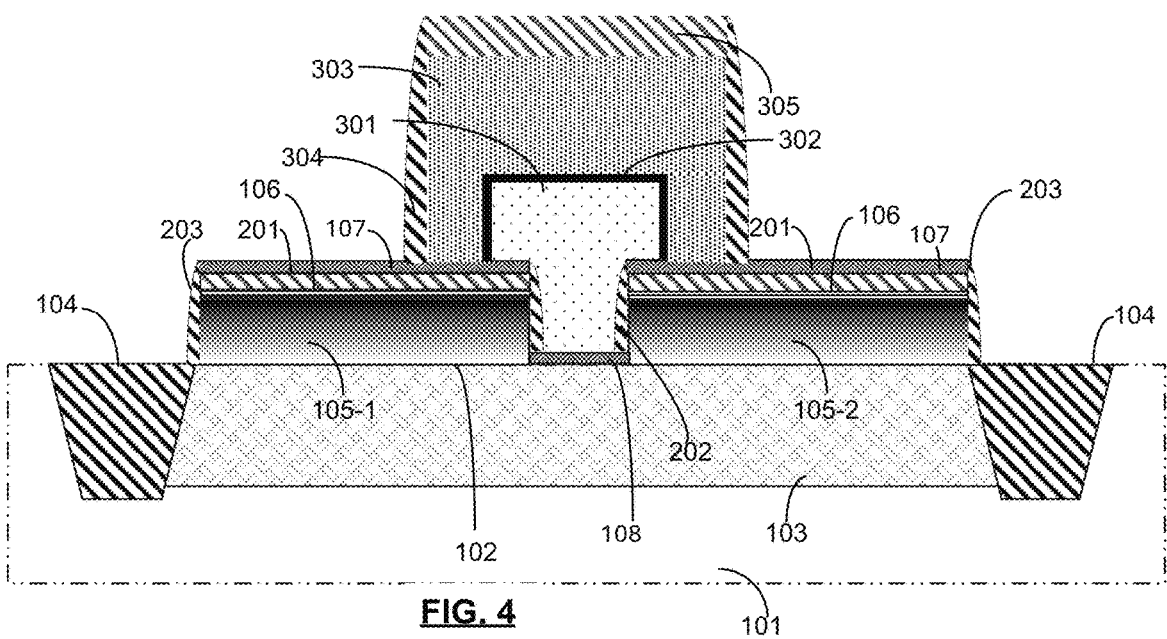

FIG. 3—is part of an exemplary and non-limiting process flow as a continuation of FIG. 2 for implementing an embodiment of the invention shown. FIG. 3 shows the isolation of the sidewalls 202 of the selective epitaxial extension 105 at the etched gate 109, etched to silicon surface 102, with the tunnel dielectric 108 deposited within the etched and defined gate width 109. The FIG. 3 also shows the selective epi sidewall isolation 203 over the isolation 104, FIG. 4—is a further part of an exemplary and nonlimiting process flow as a continuation of FIG. 3. FIG. 4 shows the deposition and defining of the floating gate 301. The conductive floating gate 301 is deposed over the tunnel dielectric 108 enabling a floating gate voltage (due to charge on the floating gate 301 to control the characteristics of a channel under the tunnel dielectric 108. The floating gate conductive material fills the insulated space between the two selective epitaxial extensions 105-1 and 105-2 and partially overlaps the selective epitaxial extensions 105-1 and 105-2. The floating gate 301 overlap on the selective epitaxial extensions 105-1 and 105-2 is isolated from the selective epitaxial extensions 105-1 and 105-2 by the thick dielectric layer 110/201 over the metallization 106 and the gate dielectric layer 107 over the thick dielectric layer 110/201. A coupling dielectric 302 is deposited to cover the sidewalls and the top of the defined floating gate. This coupling layer may be an ONO layer or similar low leakage layer allowing a high coupling ratio to be established between the floating gate 301 and a conductive control gate 303 deposited and defined to cover all sides of the floating gate 301 as shown in FIG. 4. Typically, the control gate has isolation dielectric covering it 304 and 305 as shown to protect it.

Figure 5:
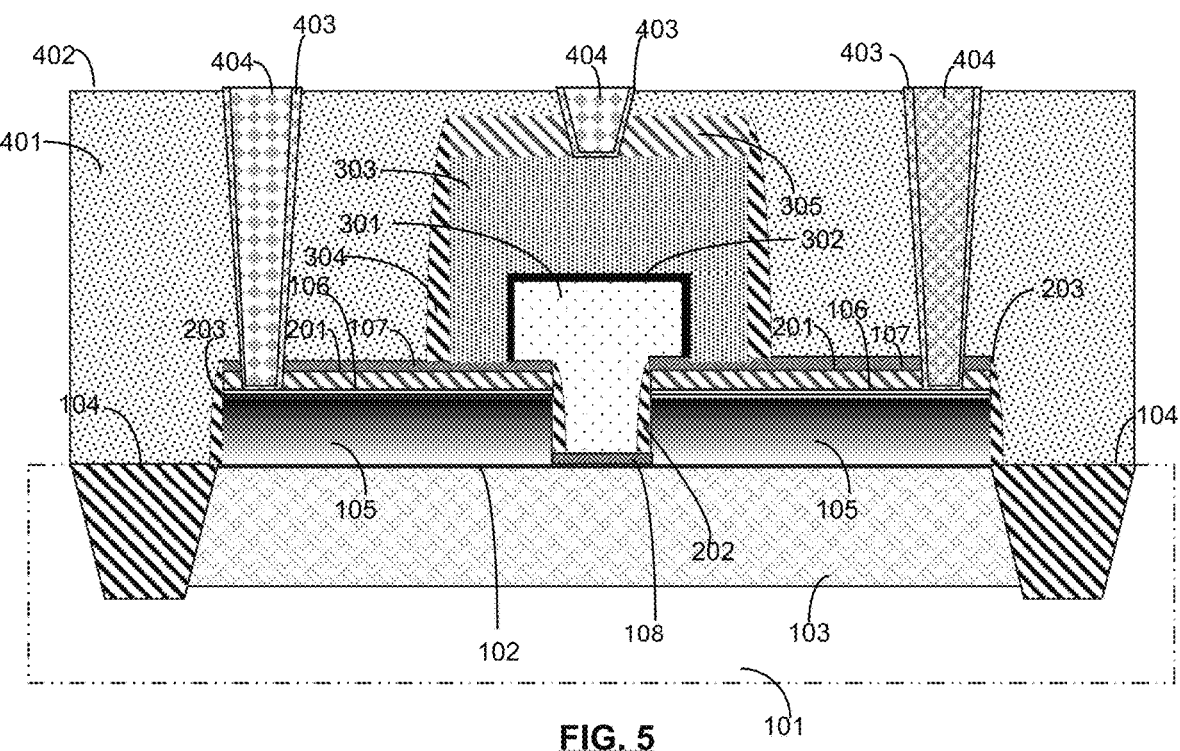

FIG. 5 shows the final steps of manufacture of FCNVM-ALEFT, An interlayer dielectric 401 is deposited to cover and protect the FCNVM device. Visas 404 are etched down to the conductive control gate 303 and to the metal layers 106 over the selective epitaxial extensions 105-1 and 105-2. Typically, a silicide deposition 403 is deposited to line the vias 404 to ensure good contact to the conductive layers. The Visa are then metal filled and polished with the interlayer dielectric 401 to have a flat surface 402 for further metallization.

The preferred embodiment of the FCNVM-ALEFT—transistor shown in FIG. 1 and FIG. 5 is shown as built on the patented ALEFT—transistor structure of U.S. Pat. No. 12,284,819, with the gate/channel region (108) defined by the separation of the selective low temperature epitaxial growth 105-1 and 105-2 used as source and drain extensions.

The Non-Volatile Memory cell of FIG. 1 formation is done by very simple process step additions to the patented ALEFT-transistor process. The added steps comprise 1. depositing a tunnel dielectric (108) Instead of the gate dielectric in the NVM device locations. 2. Splitting the deposition of the conductive floating gate material. 3. Defining the floating gate. 4. Depositing a conformal coupling dielectric, to cover the floating gate. 5. Depositing and defining a control gate to cover all sides of the floating gate and couple to the floating gate via the coupling dielectric.

The coupling dielectric (302) has to be selectively removed from the in the Non NVM regions as in the non-NVM devices the control gate is integral with the floating gate with no coupling separation. The completed FCNVM over ALEFT-memory cell comprises a tunnel dielectric (108) on the surface of a substrate with a channel in the substrate under the tunnel dielectric (108) a floating gate (301) over the tunnel dielectric (108), a conductive gate/control gate (303) coupling to the floating gate across the coupling dielectric (302). The control gate covering five sides of the floating gate (301) The structure thereby forming a non-volatile memory cell with read write capability by storing charge in the floating gate 301.

FIG. 6 is a Table 1 that provides an explanation of all the various numbers used in the Figures (FIG. 1 to FIG. 5) The numbers are further used in provide the detailed description of the device.

A typical and exemplary non-limiting process flow is provided in table 2, FIG. 7 Table 2 also identifies the number of steps, implants with thermal diffusions and masking steps in the process for the disclosed for the preferred embodiment of the FCNVM over ALEFT.

The structure and process allow either any semiconductor based substrate and process to be used with modifications to process as will be well understood by practitioners of the art. Currently the shown device and process are for a silicon gate or metal gate technology to be implemented on Silicon substate or Silicon on insulator substrate. As an exemplary process, the silicon gate process is described. If the silicon gate is considered as a sacrificial gate, the technology can be adapted for metal gate. Further the technology is also implementable on SOI wafers with equal ease.

Use of strained silicon channel can be implemented in the above-disclosed process by adding silicon germanium or other appropriate undoped epitaxial material growth in the S/D region using and extending the use of the strain material to grow the extensions. But having reduced short channel effects will allow the gate length to be reduced substantially without undue need for strain engineering and drain engineering to achieve the needed speeds. By using undoped or low-doped epitaxial silicon as part of the substrate it is possible to achieve very high mobility for the carriers (close to intrinsic mobility) with reduced drain engineering and channel strain engineering.

Referring to Table 2.

FIG. 6—Table 2 provides a listing of the steps required to implement P or N channel FCNVM-ALEFT transistor devices, of the embodiment, shown in FIG. 1, on a silicon wafer. The common steps are grouped together in the table and a comparison of number of implants and masking steps required are provided. The listing clearly shows the substantial reduction in critical process steps that are possible with the disclosed device implementation.

The low temperature deposition and post processing selective epitaxial provides almost no dopant movement from the thin selective epitaxial layer into the silicon substrate, via the contact interface from the low temperature selective source drain epitaxial extensions to the silicon substrate and the channel of the NVM-ALEFT transistor device of FIG. 1.

In addition, by providing a S/D extension which are on silicon surface almost in the plain of the channel, the impact of source and drain on the channel that creates the short channel issues, and the drain engineering requirements are reduced.

By providing non implanted preferably graded Source/Drain extensions using low temperature selective Epitaxial process and a uniformly doped well, the random variation of the threshold of the device due to random placement of dopant ions in or near the channel, namely the sigma Vt of the device is reduced substantially providing a device with capability to use lower supply voltages and scale to much smaller dimensions with very limited additional effort.

The graded low temperature Epitaxial deposition is instrumental in reducing the source drain resistance of the devices. Deposition of a metal layer on the epitaxial surface is further used to reduce the source drain resistance of the devices manufactured.

The large area of coupling between the floating gate and the control gate compared to the tunnel area provide a high coupling ratio that help to reduce the voltage on the control gate during the write operations. This is helpful in that the voltage pump design and the peripheral transistor design are made lower voltage compatible. The stress on the gate oxide of the peripheral ALEFT devices are hence reduced.

The use of five side covered floating gate reduce the impact of contamination from the post processing and packaging steps on the NVM devices.

One of the major items to be noted in comparing the characteristics of prior art devices on planar silicon surface with the characteristics of the ALEFT and the FCNVM-ALEFT device characteristics is that with the use of the ALEFT technology device channels are approximately same as the masked gate length reduced by the deposited thickness of sidewall insulators whereas the prior art devices have channel lengths defined by the extension of implanted dopant typically LDD under the gate of the devices, that tend to extend under the gate with application of voltage modulating the gate length of the devices.

Some Advantages of the Current Disclosed FCNVM-ALEFT Include:

1. Ability to scale the gate size to much smaller dimensions by using masking of the gate on flat surface and defining the gate by the separation of the low temperature selective epitaxial extensions.
2. The use of thicker protection dielectric-multiple depositions, comprising the thick dielectric, the gate/tunnel dielectric, the coupling dielectric etc. (to protect the low temperature selective epitaxial Source and drain extensions enable reduction in the gate to S/D coupling improving device performance.
3. Using the large area of coupling across the coupling dielectric, between the floating gate and the control gate of the FCNVM-ALEFT device allows a high coupling ratio between the floating gate and control gate to reduce the voltages required to write and erase the FCNVM-ALEFT device.
4. The reduced write/erase voltage requirement reduces the stress on the peripheral ALEFT transistors carrying the write/erase voltages.
5. Reducing the Vt variations due to random dopant distribution in and around the FCNVM-ALEFT transistor channel, results in a read operation that can use lower voltages than that possible today.

Note Since the channel of the NVM-ALEFT transistor is not impacted by the short channel effects, the channel length will be equal to the masked gate width. Typical transistors loose 20 to 25% of the masked gate length due to short channel effects, hence having a much shorter and variable channel length than the designed channel length.

Though the process and the implementation examples have been provided for both single crystal substrate and SOI substrate the technology shown should not be construed to be limited by the examples provided. The technology with additional changes is implementable into almost any semiconductor process, including high voltage process etc. with appropriate changes to improve the short channel effects and speed of the devices as will be well understood by practitioners of the art. These implementations though not shown in the application are being covered by the application.

Though a silicon based process is described in the current application, it should also be not considered limiting. The technology described may be implemented effectively to reduce process complexity and improve characteristic of other semiconductor devices using alternate semiconducting materials, with changes in process as will be well understood by practitioners of the art. Other typical semiconductors include but are not limited to 3-5 compounds, Silicon Carbide etc. where the patent can be effectively applied.

What is claimed is:

1. A transistor structure comprising:
   a substrate having a top planar surface;
   a selective low temperature epitaxial source region formed entirely above the top planar surface and having a first sidewall;
   a selective low temperature epitaxial drain region formed entirely above the top planar surface and having a second sidewall facing the first sidewall, wherein the selective low temperature epitaxial source region is separated from the selective low temperature epitaxial drain region by a gap defined by the first and second sidewalls;
   a gate dielectric formed in the gap and contacting the substrate;
   a first sidewall isolation on the first sidewall and above the gate dielectric;
   a second sidewall isolation on the second sidewall and above the gate dielectric;
   first and second metal layers formed above and in contact with the selective low temperature epitaxial source region and the selective low temperature epitaxial drain region, respectively;
   first and second isolation layers formed above and in contact with the first and second metal layers, respectively;
   a floating gate having a first portion filling the gap above the gate dielectric and a second portion above the first portion and extending beyond the first and second sidewalls such that the second portion overlaps the selective low temperature epitaxial source region and the selective low temperature epitaxial drain region; and
   a control gate fully covering five sides of the second portion of the floating gate, the control gate being separated from the floating gate by a coupling dielectric and being separated from the first and second metal layers by the first and second isolation layers, respectively.

2. The transistor structure of claim 1, wherein the fully covering the five sides of the second portion of the floating gate by the control gate limits contaminants from impacting a non-volatile memory operation of the transistor structure.

3. The transistor structure of claim 1, wherein the transistor structure has low threshold Vt variations, thereby enabling low voltage read operation.

4. The transistor structure of claim 1, wherein the control gate fully covering five sides of the second portion of the floating gate and separated from the floating gate by the coupling dielectric enables a large area of coupling between the floating gate and the control gate across the coupling dielectric.

5. The transistor structure of claim 4, wherein the high coupling ratio enables use of lower write and erase voltages applied to the control gate during operation than in the case of a non-volatile memory with a low coupling ratio.

6. The transistor structure of claim 1, wherein the substrate is a silicon substrate or a silicon on insulator substrate.

7. The transistor structure of claim 1, wherein the substrate is a III-V substrate or a silicon carbide substrate.

8. The transistor structure of claim 7, wherein the substrate is a gallium arsenide substrate.

9. A method for manufacturing a transistor structure comprising:

forming a substrate having a top planar surface;

forming a selective low temperature epitaxial source region entirely above the top planar surface, the selective low temperature epitaxial source region having a first sidewall;

forming a selective low temperature epitaxial drain region entirely above the top planar surface, the selective low temperature epitaxial drain region having a second sidewall facing the first sidewall, wherein the selective low temperature epitaxial source region is separated from the selective low temperature epitaxial drain region by a gap defined by the first and second sidewalls;

forming a gate dielectric in the gap and contacting the substrate;

forming a first sidewall isolation on the first sidewall and above the gate dielectric;

forming a second sidewall isolation on the second sidewall and above the gate dielectric;

forming first and second metal layers above and in contact with the selective low temperature epitaxial source region and the selective low temperature epitaxial drain region, respectively;

forming first and second isolation layers above and in contact with the first and second metal layers, respectively;

forming a floating gate having a first portion filling the gap above the gate dielectric and a second portion above the first portion and extending beyond the first and second sidewalls such that the second portion overlaps the selective low temperature epitaxial source region and the selective low temperature epitaxial drain region; and forming a control gate fully covering five sides of the second portion of the floating gate, the control gate being separated from the floating gate by a coupling dielectric and being separated from the first and second metal layers by the first and second isolation layers, respectively.

10. The method of claim 9, wherein the fully covering the five sides of the second portion of the floating gate by the control gate limits contaminants from impacting a non-volatile memory operation of the transistor structure.

11. The method of claim 9, wherein the transistor structure has low threshold Vt variations, thereby enabling low voltage read operation.

12. The method of claim 9, wherein the control gate fully covering five sides of the second portion of the floating gate and separated from the floating gate by the coupling dielectric enables a large area of coupling between the floating gate and the control gate across the coupling dielectric.

13. The method of claim 12, wherein the high coupling ratio enables use of lower write and erase voltages applied to the control gate during operation than in the case of a non-volatile memory with a low coupling ratio.

14. The method of claim 9, wherein the substrate is a silicon substrate or a silicon on insulator substrate.

15. The method of claim 9, wherein the substrate is a III-V substrate or a silicon carbide substrate.

16. The method of claim 15, wherein the substrate is a gallium arsenide substrate.

\* \* \* \* \*